(12) United States Patent
Tu

(10) Patent No.: US 9,368,567 B2
(45) Date of Patent: *Jun. 14, 2016

(54) SEMICONDUCTOR DEVICES, METHODS OF MANUFACTURE THEREOF, AND METHODS OF MANUFACTURING CAPACITORS

(71) Applicant: Taiwan Semiconductor Manufacturing Company, Ltd., Hsin-Chu (TW)

(72) Inventor: Kuo-Chi Tu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/695,303

(22) Filed: Apr. 24, 2015

(65) Prior Publication Data

US 2015/0228711 A1 Aug. 13, 2015

Related U.S. Application Data

(63) Continuation of application No. 13/472,304, filed on May 15, 2012, now Pat. No. 9,048,212.

(51) Int. Cl.
*H01L 21/8242* (2006.01)
*H01L 49/02* (2006.01)
*H01L 21/3213* (2006.01)

(52) U.S. Cl.
CPC .......... *H01L 28/75* (2013.01); *H01L 21/32134* (2013.01); *H01L 28/40* (2013.01); *H01L 28/60* (2013.01); *H01L 28/65* (2013.01); *H01L 28/92* (2013.01)

(58) Field of Classification Search
CPC .................. H01L 27/10829; H01L 27/10838; H01L 27/10861; H01L 27/10864; H01L 27/10876
USPC .................................. 438/243, 244, 386, 387
See application file for complete search history.

(56) References Cited

U.S. PATENT DOCUMENTS

| | | | |
|---|---|---|---|
| 5,416,037 A | 5/1995 | Sato et al. | |
| 6,693,017 B1 | 2/2004 | Fayaz et al. | |
| 7,109,090 B1 | 9/2006 | Huang et al. | |
| 7,728,372 B2 | 6/2010 | Eshun et al. | |
| 9,048,212 B2 * | 6/2015 | Tu | H01L 28/40 |
| 2010/0078759 A1 * | 4/2010 | Sekar | H01L 45/00 257/530 |
| 2011/0233722 A1 | 9/2011 | Liang et al. | |

* cited by examiner

*Primary Examiner* — Brook Kebede
(74) *Attorney, Agent, or Firm* — Slater Matsil, LLP

(57) ABSTRACT

Semiconductor devices, methods of manufacture thereof, and methods of manufacturing capacitors are disclosed. In an embodiment, a method of manufacturing a capacitor includes: etching a trench in a workpiece. The trench may extend into the workpiece from a major surface of the workpiece. The method further includes lining the trench with a bottom electrode material and lining the bottom electrode material in the trench with a dielectric material. The dielectric material may have edges proximate the major surface of the workpiece. The method further includes forming a top electrode material over the dielectric material in the trench, and etching away a portion of the bottom electrode material and a portion of the top electrode material proximate the edges of the dielectric material.

20 Claims, 9 Drawing Sheets

US 9,368,567 B2

SEMICONDUCTOR DEVICES, METHODS OF MANUFACTURE THEREOF, AND METHODS OF MANUFACTURING CAPACITORS

PRIORITY CLAIM AND CROSS-REFERENCE

This application is a continuation of U.S. patent application Ser. No. 13/472,304, filed on May 15, 2012, entitled "Semiconductor Devices, Methods of Manufacture Thereof, and Methods of Manufacturing Capacitors," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Capacitors are elements that are used extensively in semiconductor devices for storing an electrical charge. Capacitors essentially comprise two conductive plates separated by an insulating or dielectric material. Capacitors are used in applications such as electronic filters, analog-to-digital converters, memory devices, control applications, and many other types of semiconductor device applications.

Reactive ion etch (RIE) processes are used to form electrodes of capacitors in some manufacturing processes for semiconductor devices. These RIE processes cause erosion of and damage to dielectric layers of capacitors, particularly at the dielectric layer edges, which can significantly deteriorate the reliability of capacitors.

Improved methods of manufacturing capacitors of semiconductor devices are needed in the art.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to manufacturing processes for semiconductor devices, and more particularly to the formation of capacitors of semiconductor devices. Novel semiconductor devices, methods of manufacture thereof, and methods of manufacturing capacitors will be described herein.

Figure 1A:
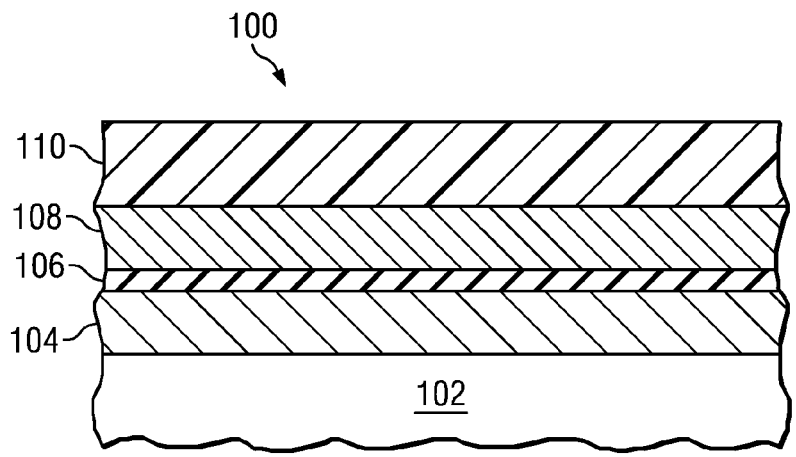
FIGS. 1A through 1D show cross-sectional views of a method of manufacturing a planar capacitor of a semiconductor device at various stages of manufacturing in accordance with an embodiment.

FIGS. 1A through 1D show cross-sectional views of a method of manufacturing a planar capacitor 120 of a semiconductor device 100 at various stages of manufacturing in accordance with an embodiment. Referring first to FIG. 1A, a workpiece 102 is provided. The workpiece 102 may include a semiconductor substrate comprising silicon or other semiconductor materials. The workpiece 102 may be covered by an insulating layer (not shown in FIG. 1A; see insulating layer 132 in FIG. 3A), for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A bottom electrode 104 material is formed over the workpiece 102, as shown in FIG. 1A. The bottom electrode 104 material lines a top surface of the workpiece 102. The bottom electrode 104 material comprises a layer of conductive material, such as titanium nitride (TiN), tantalum nitride (TaN), tungsten (W), tungsten nitride (WN), ruthenium (Ru), iridium (Ir), and platinum (Pt), other conductive materials, or combinations or multiple layers thereof. The bottom electrode 104 material comprises a low-resistivity material in some embodiments, for example. The bottom electrode 104 material may be formed by chemical vapor deposition (CVD), physical vapor deposition (PVD), sputtering, or other processes. The bottom electrode 104 material may comprise a thickness of about 500 Angstroms or less in some embodiments. The bottom electrode 104 material may comprise a thickness of about 50 to 450 Angstroms in other embodiments. Alternatively, the bottom electrode 104 material may comprise other materials and dimensions, and may be formed using other methods.

A capacitor dielectric 106 material is formed over the workpiece 102, also shown in FIG. 1A. The capacitor dielectric 106 material lines the top surface of the bottom electrode 104 material. The capacitor dielectric 106 material may comprise a high dielectric constant (K) dielectric film, such as $ZrO_2$, $HFO_2$, $Ta_2O_5$, $Al_2O_3$, $(BaSr)TiO_3$ (BST), $(Pb,Zr)TiO_3$ (PZT), other multi-layer high-K dielectric materials, an oxide, a nitride, or the like, or combinations or multiple layers thereof, as examples. The capacitor dielectric 106 material may be formed by CVD techniques and may comprise a thickness of about 500 Angstroms or less. In some embodiments, the capacitor dielectric 106 material comprises a thickness of about 10 to 400 Angstroms. Alternatively, the capacitor dielectric 106 material may comprise other materials and dimensions, and may be formed using other methods.

Next, a top electrode 108 material is formed over the capacitor dielectric 106 material, as shown in FIG. 1A. The top electrode 108 material may comprise similar materials and may be formed using similar deposition methods as described for the bottom electrode 104 material. In some embodiments, the top electrode 108 material may comprise about the same thickness as the thickness of the bottom electrode 104 material, for example. Alternatively, the top electrode 108 material may comprise a greater thickness than the thickness of the bottom electrode 104 material, and the top electrode 108 material may comprise a different material than the bottom electrode 104 material. The top electrode 108 material may comprise a thickness of about 50 to 5,000 Angstroms in some embodiments, although alternatively, the top electrode 108 material may comprise other materials and dimensions, and may be formed using other methods.

Figure 1B:
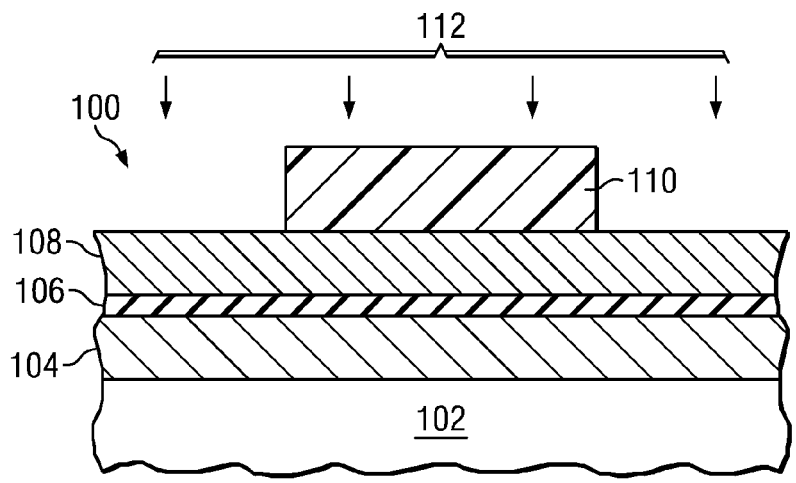

The top electrode 108 material, the capacitor dielectric 106 material, and the bottom electrode material 104 are patterned by depositing a layer of photoresist 110 over the top surface of the top electrode 108 material, as shown in FIG. 1A. The layer of photoresist 110 is then patterned using lithography. The layer of photoresist 110 may be exposed using light or energy through or reflected from a lithography mask (not shown) having a pattern thereon, for example. The layer of photoresist 110 is developed, and portions of the layer of photoresist 110 are ashed and/or etched away, leaving the patterned layer of photoresist 110 disposed over the top electrode 108 material, as shown in FIG. 1B. Alternatively, the layer of photoresist 110 may be directly patterned.

Figure 1C:
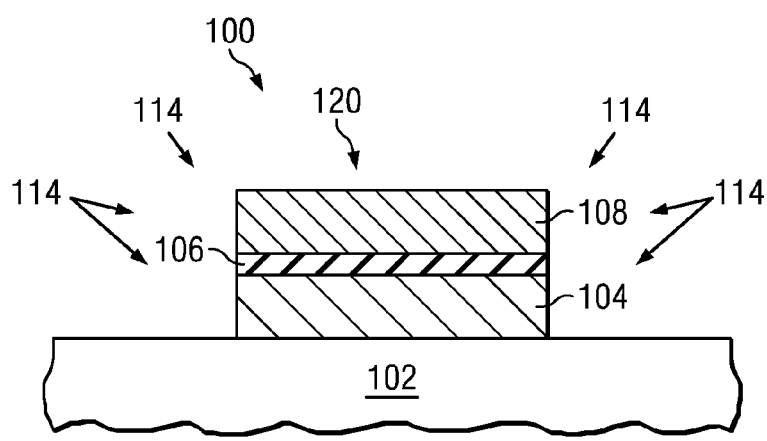

The patterned layer of photoresist 110 is used as an etch mask while portions of the top electrode 108 material, the capacitor dielectric 106 material, and the bottom electrode 104 material are etched away. An etch process 112 is used to etch away exposed portions of the top electrode 108 material, the capacitor dielectric 106 material, and the bottom electrode 104 material, leaving a top electrode 108, capacitor dielectric 106, and bottom electrode 104 that form a capacitor 120 that is planar disposed over the workpiece 102, as shown in FIG. 1C. The etch process 112 is also referred to herein as a first etch process. The etch process 112 may comprise a plasma etch process and may comprise a RIE process in some embodiments, for example. The etch process 112 may comprise a dry etch process in which the workpiece 102 is immersed in a plasma-containing etching species, wherein a chemical etching reaction takes place in multiple directions (i.e., isotropic etching). The etch process 112 may comprise an etch process performed in a gas phase, using a chemical etch process, ion milling, or a combination thereof, as examples. Alternatively, the etch process 112 may comprise other types of etch processes.

Only one capacitor 120 is shown in FIG. 1C; however, a plurality of capacitors 120 may be formed across a top surface of the workpiece 102. The number of capacitors 120 formed varies depending on the application of the semiconductor device 100. The capacitors 120 may have a round, oval, square, or rectangular shape in a top view of the workpiece 102, as examples. Alternatively, the capacitors 120 may comprise other shapes.

Figure 1D:
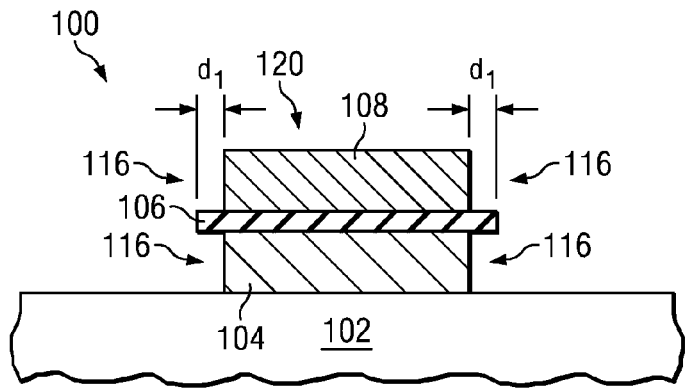

In accordance embodiments of the present disclosure, a portion of the bottom electrode 104 and a portion of the top electrode 108 are removed proximate edges of the capacitor dielectric 106 using a second etch process 114, as shown in FIG. 1C, leaving a capacitor 120 shown in FIG. 1D wherein the top electrode 108 and the bottom electrode 104 have recessed edges. A portion of the capacitor dielectric 106 protrudes from edges of the bottom electrode 104 and the top electrode 108. The second etch process 114 laterally etches away portions of the top electrode 108 and the bottom electrode 104 by a predetermined distance $d_1$ away from the edges of the capacitor dielectric 106. The portion of the bottom electrode 104 and the portion of the top electrode 108 that are etched away and removed are illustrated by recesses 116 in the bottom electrode 104 and the top electrode 108 in FIG. 1D.

The second etch process 114 comprises an etch process that is isotropic and highly selective to the material of the capacitor dielectric 106, so that substantially no amount of or a small amount of the capacitor dielectric 106 is removed during the etch process 114. The etch process 114 may comprise a gas etch process or a liquid etch process, as examples. The etch process 114 may comprise applying a dilute aqueous solution of ammonium hydroxide and hydrogen peroxide, i.e., a diluted ammonia and peroxide mixture (DAPM), in some embodiments, as examples. The etch process 114 may comprise an erosion chemical suitable for etching the specific type of bottom electrode 104 and top electrode 108 material, for example. The etch process 114 simultaneously removes a portion of sidewalls of the top electrode 108 and a portion of sidewalls of the bottom electrode 104, for example. The etch process 114 pulls back the bottom electrode 104 and the top electrode 108 away from the edges of the capacitor dielectric 106 by a dimension $d_1$ comprising about 5 to 300 Angstroms in some embodiments. Alternatively, other types of etch processes may be used to recess the top electrode 108 and the bottom electrode 104, and dimension $d_1$ may comprise other values.

In some embodiments, the bottom electrode 104 comprises a first thickness, and the top electrode 108 comprises a second thickness. Removing a portion of the bottom electrode 104 and a portion of the top electrode 108 using the second etch process 114 may comprise removing substantially the entire first thickness of the bottom electrode 104 and substantially the entire second thickness of the top electrode 108 proximate the edges of the capacitor dielectric 106 by a predetermined distance comprising dimension $d_1$, in these embodiments.

The second etch process 114 may also remove a portion of the top surface of the top electrode 108, not shown. The thickness of the top electrode 108 material may be increased to accommodate for the anticipated top surface material removal, for example. Alternatively, the layer of photoresist 110 may be left remaining after patterning the top electrode 108 material, capacitor dielectric 106 material, and the bottom electrode 104 material in order to protect the top surface of the top electrode 108 during the second etch process 114, for example, not shown in the drawings.

Figure 1E:
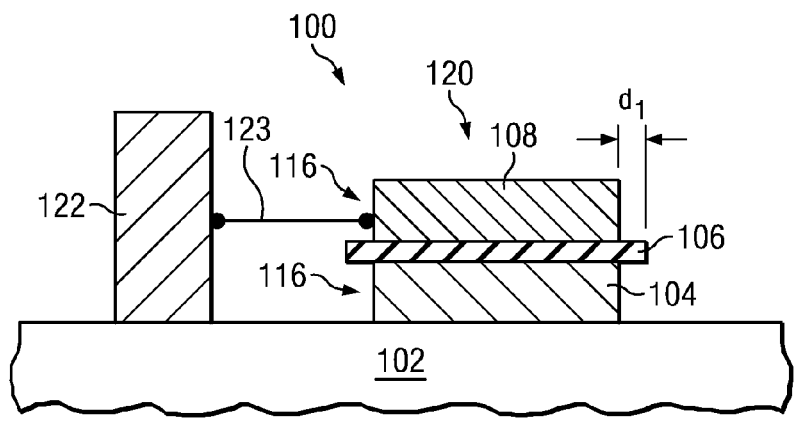
FIG. 1E is a cross-sectional view and FIG. 1F is a top view illustrating an advantage of the embodiment shown in FIGS. 1A through 1D.
Figure 1F:
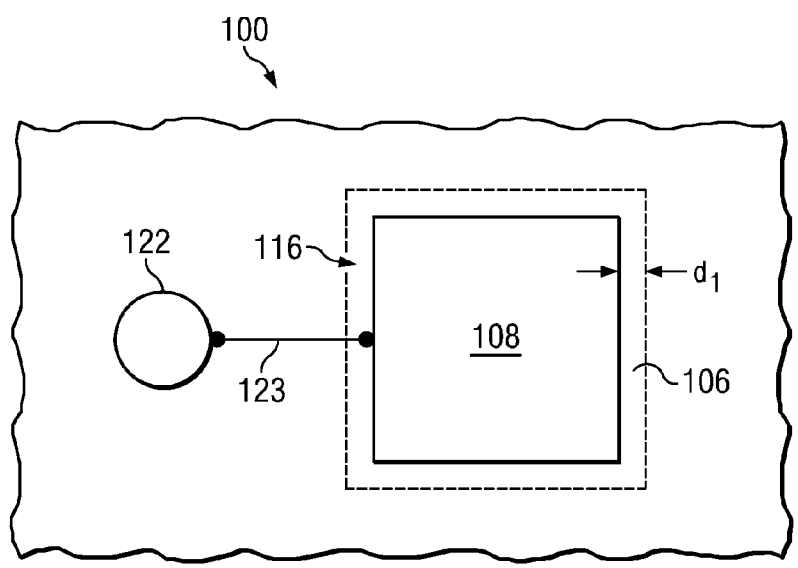

The first etch process 112 may damage the sidewalls and/or edges of the capacitor dielectric 106, particularly if the first etch process 112 comprises a RIE process. The second etch process 114 advantageously pulls back the sidewalls of the electrodes 104 and 108 away from the edges of the capacitor dielectric 106 so that performance of the capacitor 120 is not deleteriously affected by the damage to the capacitor dielectric 106 sidewalls. Furthermore, a process window for isolation between the capacitor 120 and a conductive feature 122 is enhanced by recessing the electrodes 104 and 108 away from edges of the capacitor dielectric 106, as shown in a cross-sectional view in FIG. 1E and as shown in a top view in FIG. 1F. The conductive feature 122 may comprise a conductive line, a conductive via, or a contact formed over the workpiece 102 that is electrically connected to one of the capacitor electrodes 104 or 108 (i.e., coupled to the top electrode 108 as shown in FIG. 1E). The conductive feature 122 may be coupled to the top electrode 108 (or to the bottom electrode 104, not shown) by wiring 123 in the same material layer the top electrode 108 is formed in, or in a material layer disposed over the top electrode 108, as examples. The conductive feature 122 provides electrical contact to the top electrode 108.

In the embodiment shown in FIGS. 1A through 1D, a planar capacitor 120 with recessed electrodes 104 and 108 comprises electrodes 104 and 108 that comprise one layer of a conductive material such as TiN, TaN, W, WN, Ru, Ir, Pt, other conductive materials, or combinations and multiple layers thereof. In other embodiments, the electrodes 104 and 108 may comprise multiple material layers that include other types of materials. As an example, FIGS. 2A through 2D illustrate cross-sectional views of a planar capacitor 120 manufacturing method at various stages in accordance with another embodiment. Like numerals are used for the various elements that were used to describe the previous figures, and to avoid repetition, each element number is not described again herein.

First, a bottom electrode 104/124 material is formed over the workpiece 102, as shown in FIG. 1A. The bottom electrode 104/124 material comprises a first layer 104 that is adjacent the capacitor dielectric 106 material and a second layer 124 that is adjacent the first layer 104. To form the bottom electrode 104/124 material, the second layer 124 is formed over the workpiece 102. The second layer 124 may comprise copper (Cu), titanium (Ti), tantalum (Ta), W, Ru, WN, Ir, Pt, other conductive materials, or combinations and multiple layers thereof, deposited by similar methods and comprising similar dimensions as were described for the bottom electrode 104 material in the embodiment shown in FIGS. 1A through 1D. The second layer 124 material comprises a low-resistivity material in some embodiments, for example. The second layer 124 comprises a different material than the first layer 104. The first layer 104 comprises a material with an etch selectivity to the second layer 124. The first layer 104 is formed over the second layer 124. The first layer 104 comprises similar materials, dimensions, and formation methods as were described for the bottom electrode 104 material in FIGS. 1A through 1D. Alternatively, the first layer 104 and second layer 124 of the bottom electrode 104/124 material may comprise other materials and dimensions, and may be formed using other methods.

In some embodiments, the first layer 104 may also function as a liner material or a barrier layer for the second layer 124. The first layer 104 may protect the capacitor dielectric 106 material from contamination or diffusion of the second layer 124 material into the capacitor dielectric 106 material, in some embodiments.

Figure 2A:
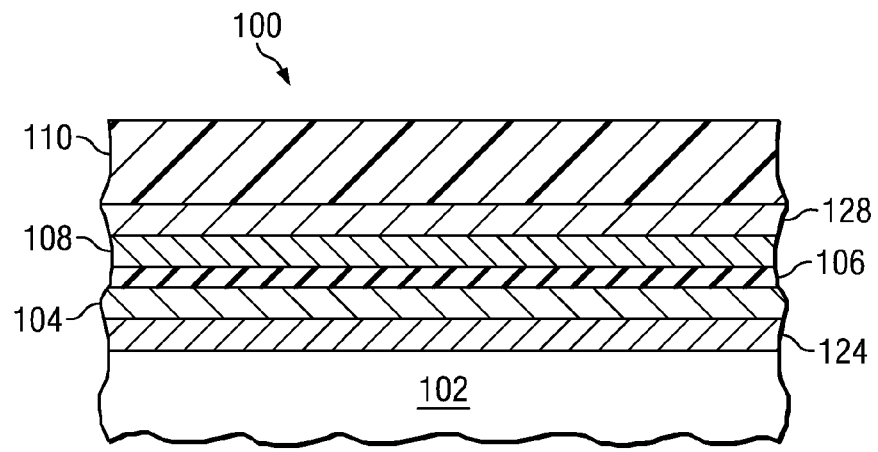
FIGS. 2A through 2D illustrate cross-sectional views of a planar capacitor manufacturing method at various stages in accordance with another embodiment.

The capacitor dielectric 106 material is formed over the bottom electrode 104/124 material, e.g., over the first layer 104, as shown in FIG. 2A. A top electrode 108/128 material is then formed over the capacitor dielectric 106 material. The top electrode 108/128 also comprises a first layer 108 adjacent the capacitor dielectric 106 and a second layer 128 adjacent the first layer 108 in the embodiment shown. The first layer 108 is formed over the capacitor dielectric 106 material. The first layer 108 comprises similar materials, dimensions, and formation methods as were described for the top electrode 108 material in the embodiment shown in FIGS. 1A through 1D. The second layer 128 is formed over the first layer 108. The second layer 128 of the top electrode 108/128 comprises similar materials, dimensions, and formations methods as were described for the second layer 124 of the bottom electrode 104/124. The second layer 128 comprises a different material than the first layer 108. Alternatively, the first layer 108 and the second layer 128 of the top electrode 108/128 material may comprise other materials and dimensions, and may be formed using other methods.

Figure 2B:
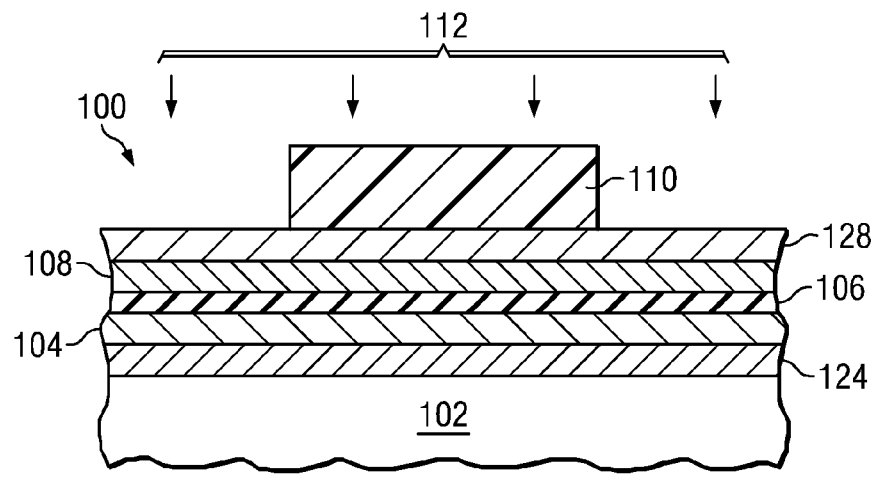
Figure 2C:
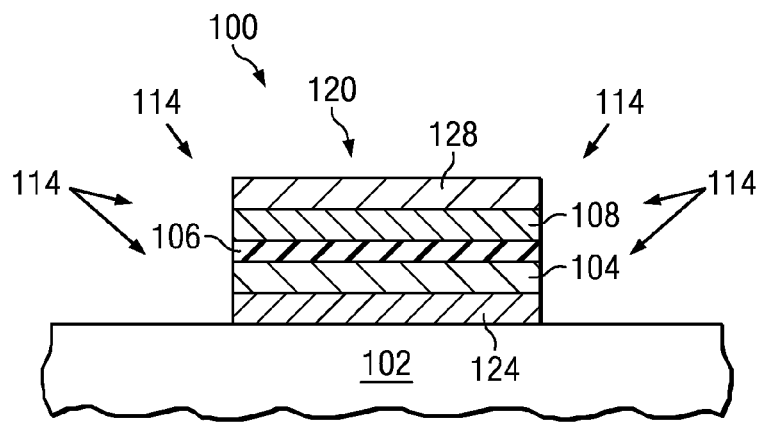

A layer of photoresist 110 is formed over the second layer 128 of the top electrode 108/128, also shown in FIG. 2A. The layer of photoresist 110 is patterned and used as an etch mask during the first etch process 112, as shown in FIG. 2B. The resulting capacitor 120 is shown in FIG. 2C, which comprises a top electrode 108/128, a capacitor dielectric 106, and a bottom electrode 104/124. The capacitor 120 is planar over the workpiece 102 and includes multi-layer electrodes 104/124 and 108/128.

Figure 2D:
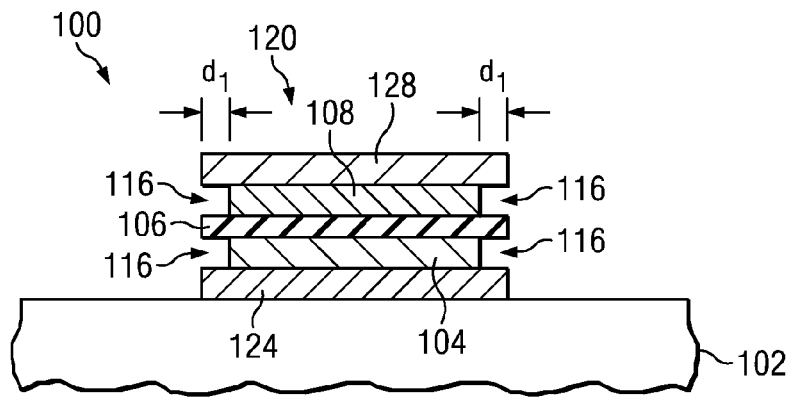

The second etch process 114 is performed, as shown in FIG. 2C, resulting in the structure shown in FIG. 2D. The first layers 104 and 108 of the bottom electrode 104/124 and the top electrode 108/128, respectively, are recessed during the second etch process 114 by an amount comprising dimension $d_1$. The first layers 104 and 108 include recesses 116 formed therein proximate the edges of the capacitor dielectric 106. However, the second layers 124 and 128 of the bottom electrode 104/124 and the top electrode 108/128, respectively, are not recessed during the second etch process 114, as shown. The second etch process 114 may comprise an etchant substance that is adapted to etch the first layers 104 and 108 but not substantially etch the second layers 124 and 128, the dielectric material 106, or the workpiece 102, for example. The second layers 124 and 128 of the bottom electrode 104/124 and the top electrode 108/128 comprise a width that is substantially the same as a width of the capacitor dielectric 106 after the second etch process 114.

Thus, in the embodiment shown in FIGS. 2A through 2D, a portion of the bottom electrode 104/124 proximate the edges of the capacitor dielectric 106 is laterally etched away that comprises the first layer 104 of the bottom electrode 104/124. The portion of the bottom electrode 104/124 that is etched away and removed is illustrated by recesses 116 in the first layer 104 in FIG. 2D. Likewise, a portion of the top electrode 108/128 proximate the edges of the capacitor dielectric 106 is etched away that comprises the first layer 108 of the top electrode 108/128. The portion of the top electrode 108/128 that is etched away and removed is illustrated by recesses 116 in the first layer 108 in FIG. 2D.

In FIGS. 2A through 2D, both the bottom electrode 104/124 and the top electrode 108/128 of the capacitor 120 comprise multiple layers comprising the first layer 104 and second layer 124, and the first layer 108 and second layer 128, respectively. Alternatively, the bottom electrode may comprise a single layer bottom electrode 104 as shown in FIGS. 1A through 1D, and the top electrode may comprise a multiple layer top electrode 108/128 shown in FIG. 2A through 2D. Likewise, the top electrode may comprise a single layer top electrode 108 as shown in FIGS. 1A through 1D, and the bottom electrode may comprise a multiple layer bottom electrode 104/124 shown in FIGS. 2A through 2D.

The embodiments shown in FIGS. 1A through 1D and FIGS. 2A through 2D show implementations of the present disclosure used to manufacture planar capacitors 120. The planar capacitors 120 comprise capacitor material stacks disposed over a flat surface of the workpiece 102. Edges of the capacitor dielectric 106 of the capacitors 120 are disposed at sidewalls of the capacitor dielectric 106 in these embodiments. Advantageously, only one lithography mask and one lithography process is needed to form the planar capacitors 120; i.e., the lithography mask and process used to pattern the capacitor material stack comprising the top electrode 108 or 108/128 material, the capacitor dielectric 106 material, and the bottom dielectric 104 or 104/124 material.

Embodiments of the present disclosure may also be implemented in capacitors formed in trenches of the workpiece 102. FIGS. 3A through 3D, FIGS. 4A through 4C, and FIGS. 5A through 5C show embodiments of capacitors 120 formed using damascene methods wherein a portion of the top electrodes and bottom electrodes are recessed in a vertical direction proximate edges of the capacitor dielectric 106. Again, like numerals are used for the various elements as were used to describe the previous figures, and to avoid repetition, each element number is not described again herein.

Figure 3A:
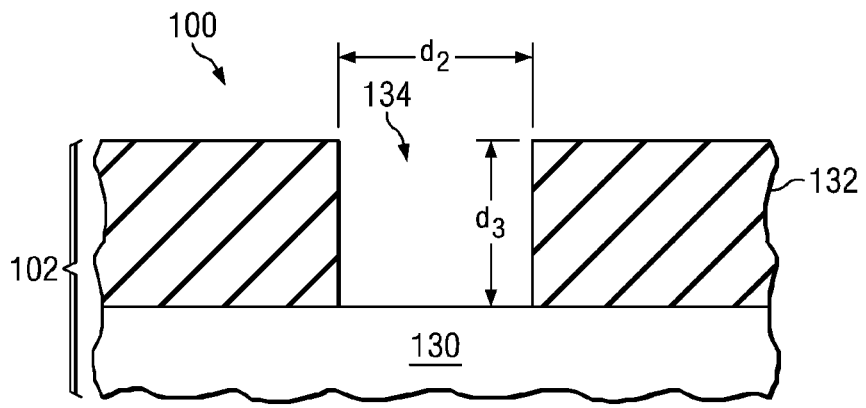
FIGS. 3A through 3D are cross-sectional views of a method of manufacturing a trench capacitor of a semiconductor device at various stages of manufacturing in accordance with an embodiment.

Referring next to FIGS. 3A through 3D, cross-sectional views of a method of manufacturing a trench capacitor 120 of a semiconductor device 100 at various stages of manufacturing in accordance with an embodiment are shown. In FIG. 3A, a workpiece 102 is shown that includes a substrate 130 comprising a semiconductive material. The workpiece 102 may also include an optional insulating material layer 132 disposed over the substrate 130. The insulating material layer 132 may comprise an oxide, a nitride, or combinations or multiple layers thereof, as examples. A trench 134 is formed in the workpiece 102 using lithography, e.g., by depositing a layer of photoresist (not shown) over the workpiece 102, patterning the photoresist, and using the photoresist as an etch mask while top portions of the workpiece 102 are etched away, leaving the trench 134 shown in FIG. 3A. Alternatively, the trench 134 may be formed using other methods.

The trench 134 may be formed within the insulating material layer 132 disposed over the substrate 130. The trench 134 may extend completely through the insulating material layer 132, as shown. Alternatively, the trench 134 may extend partially through the insulating material layer 132, or the trench 134 may extend completely through the insulating material layer 132 and partially through the substrate 130, not shown in the drawings.

The trench 134 may have a width comprising a dimension $d_2$ of about 0.1 µm or less, for example. The trench 134 may have a depth comprising dimension $d_3$ extending vertically into the workpiece 102 of about 1 µm or less, for example. Alternatively, dimensions $d_2$ and $d_3$ may comprise other values. The trench 134 may comprise a round, oval, square, rectangular, or other shape in a top view of the workpiece 102. Only one trench 134 is shown in FIG. 3A; however, a plurality of trenches 134 may be formed across a top surface of the workpiece 102. The number of trenches 134 formed varies depending on the application of the semiconductor device 100 and number of capacitors to be formed.

A cross-section of the trench 134 may comprise a variety of shapes, depending on many factors, such as the crystalline structure of the workpiece 102 and/or the chemistries, temperature, or duration of the etch process used to form the trench 134, as examples. The trench 134 comprises sidewalls that are substantially straight in a vertical direction within the workpiece 102 in the embodiments shown herein. The trench 134 may be formed using a substantially isotropic etch process in some embodiments to form substantially vertical sidewalls, although alternatively, the trench 134 may be formed using other methods. The trench 134 may alternatively be slightly bowed (not shown), having a smaller width proximate the opening of the trench 134 in the top surface of the workpiece 102 than a width at a lower region of the trench 134. The trench 134 may alternatively be bottle-shaped, as another example, also not shown.

Figure 3B:
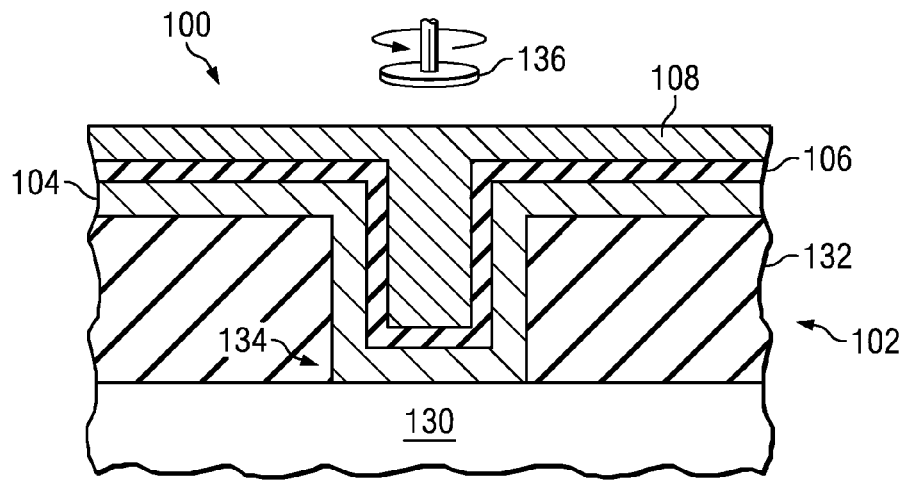

After forming the trench 134 in the workpiece 102, the bottom electrode 104 material is formed over the workpiece 102, as shown in FIG. 3B. The bottom electrode 104 material lines the top surfaces of the workpiece 102 and the sidewalls and the bottom surface of the trench 134. The capacitor dielectric 106 material is formed over the workpiece 102 over the bottom electrode 104 material. The capacitor dielectric 106 lines the bottom electrode 104 material on the top surface of the workpiece 102 and on the sidewalls and bottom surface of the trench 134. A top electrode 108 material is formed over the capacitor dielectric 106 material, also shown in FIG. 3B. The top electrode 108 material substantially fills an inner region of the trench 134, as shown. The materials, dimensions, and formation methods for the bottom electrode 104 material, the capacitor dielectric 106 material, and the top electrode 108 material may be the same as described for the previous embodiments herein.

Figure 3C:
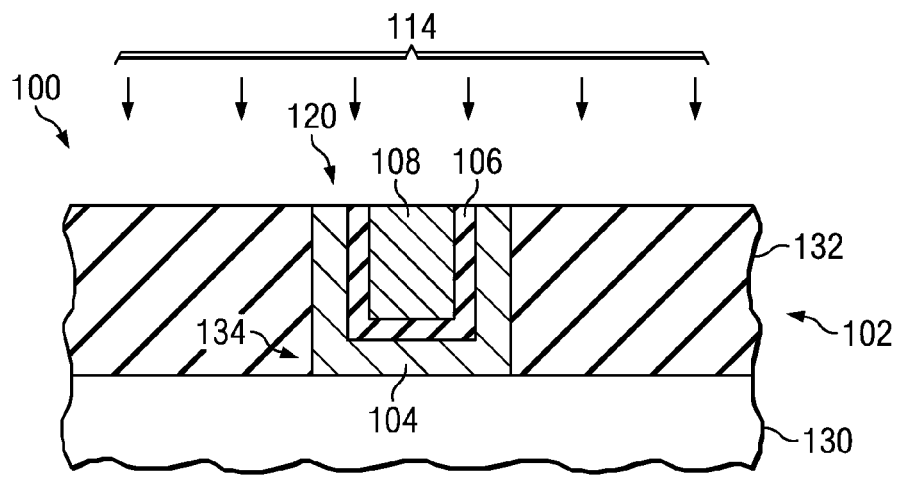

A chemical-mechanical polishing (CMP) process 136, an etch-back process, or a combination thereof, as examples, are used to remove the excess top electrode 108 material, capacitor dielectric 106 material, and bottom electrode 104 material from over the top surface of the workpiece 102, as shown in FIG. 3B, leaving a capacitor 120 formed within the trench 134, as shown in FIG. 3C. The first etch process 112 is not included in the manufacturing method for this embodiment; rather, the top electrode 108 material, the capacitor dielectric 106 material, and the bottom electrode 104 material are patterned using the CMP process 136 and/or etch process. The bottom electrode 104 lines the sidewalls and bottom surface of the trench 134. The capacitor dielectric 106 lines the bottom electrode 104, and the top electrode 108 fills in the remainder of the trench 134.

Figure 3D:
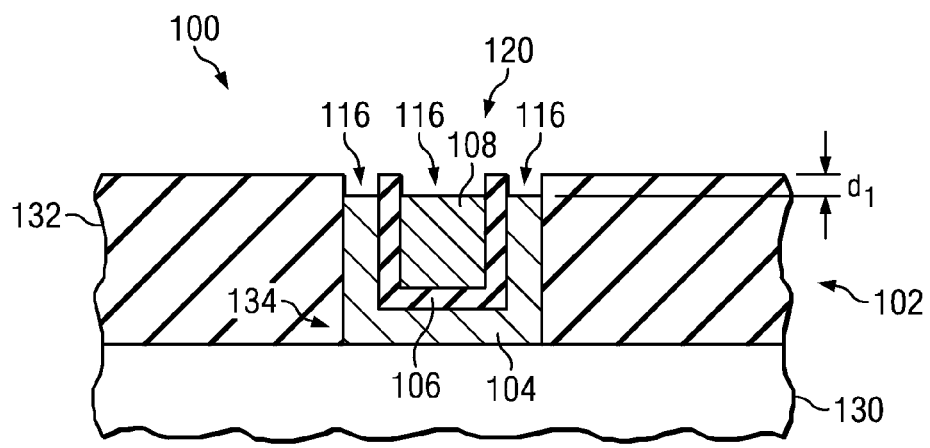

In accordance embodiments of the present disclosure, a portion of the bottom electrode 104 and a portion of the top electrode 108 are removed proximate edges of the capacitor dielectric 106 using the second etch process 114 described for the previous embodiments, as shown in FIG. 3C, leaving a capacitor 120 shown in FIG. 3D wherein the top electrode 108 and bottom electrode 104 have recessed edges. A portion of the capacitor dielectric 106 protrudes from edges of the bottom electrode 104 and the top electrode 108. The second etch process 114 vertically etches away portions of the top electrode 108 and the bottom electrode 104 by a predetermined distance comprising dimension $d_1$ away from the edges of the capacitor dielectric 106. The edges of the capacitor dielectric 106 comprise the exposed top surfaces of the capacitor dielectric 106, which are substantially coplanar with the top surface of the workpiece 102. The portion of the bottom electrode 104 and the portion of the top electrode 108 that are etched away and removed are illustrated by recesses 116 in the top surfaces of the bottom electrode 104 and the top electrode 108 in FIG. 3D.

Figure 3E:
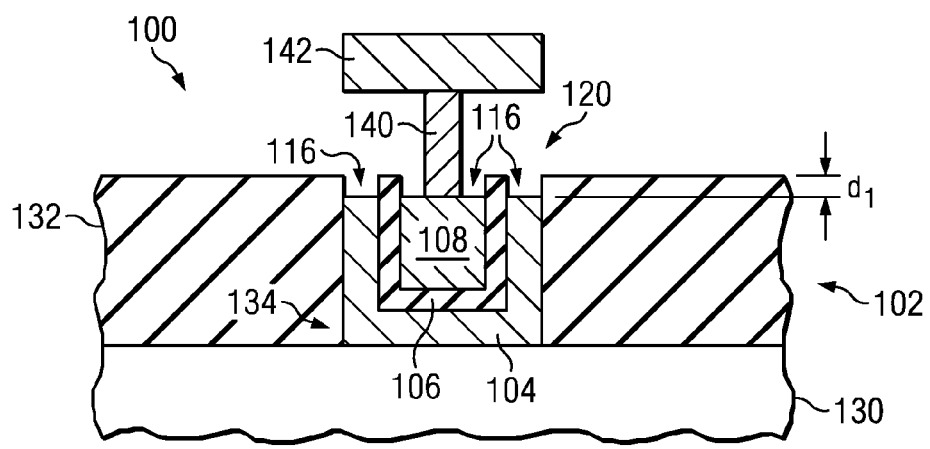
FIG. 3E is a cross-sectional view illustrating an advantage of the embodiment shown in FIGS. 3A through 3D.

FIG. 3E is a cross-sectional view of the semiconductor device 100 illustrating an advantage of the embodiment shown in FIGS. 3A through 3D. In a subsequent manufacturing step, a conductive feature comprising a contact or via 140 may be formed over the top electrode 108, and a conductive feature comprising a conductive line 142 may be formed over the contact or via 140, e.g., in subsequently-formed metallization or conductive material layers. Advantageously, the recessed top electrode 108 material provides an enhanced isolation process window between the capacitor 120 and the contact or via 140.

In the embodiment shown in FIGS. 3A through 3D, the bottom electrode 104 and the top electrode 108 comprise one layer of a conductive material such as TiN, TaN, W, WN, Ru, Ir, Pt, other conductive materials, or combinations and multiple layers thereof. The bottom electrode 104 and the top electrode 108 material comprise low-resistivity materials in some embodiments, for example. In other embodiments shown in FIGS. 4A through 4C and 5A through 5C, electrodes of the capacitors 120 may comprise multiple material layers that include other types of materials, similar to the embodiment shown in FIGS. 2A through 2D.

Figure 4A:
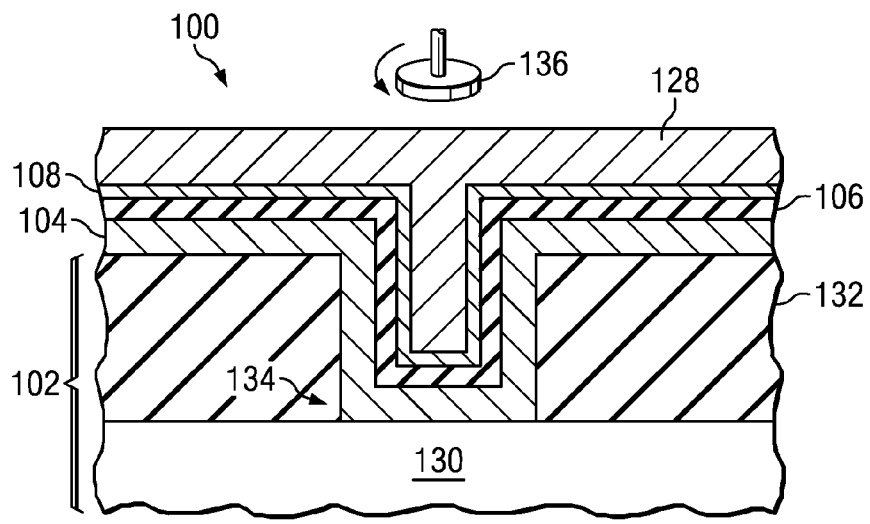
FIGS. 4A through 4C illustrate cross-sectional views of a trench capacitor manufacturing method at various stages in accordance with another embodiment.
Figure 4B:
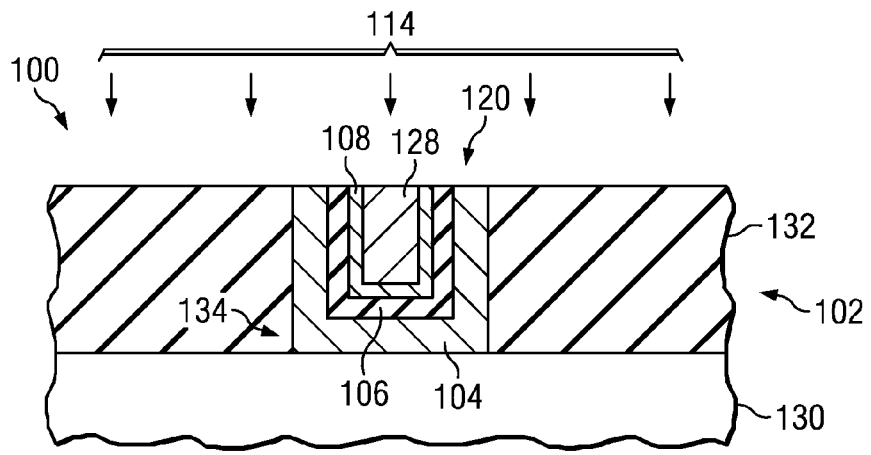
Figure 4C:
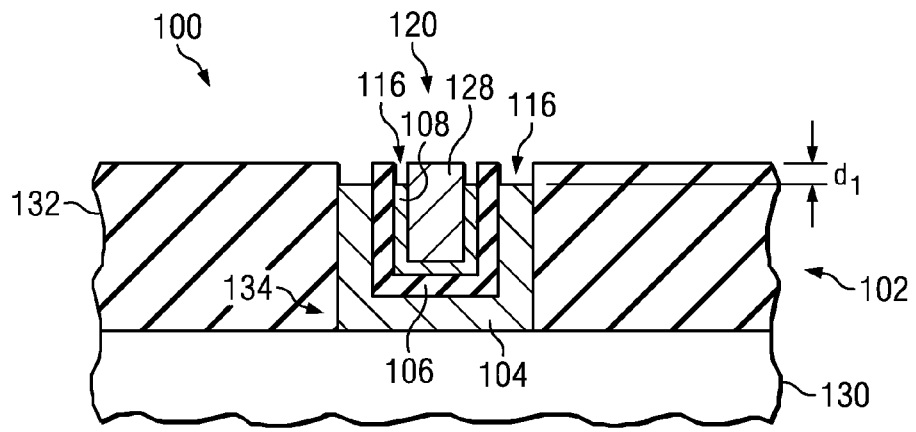

FIGS. 4A through 4C illustrate cross-sectional views of a trench capacitor 120 manufacturing method at various stages in accordance with another embodiment, wherein the top electrode 108/128 material includes a first layer 108 and a second layer 128. The first layer 108 is formed over and lines the capacitor dielectric 106 material, and the second layer 128 is formed over the first layer 108, filling the trench 134. A CMP process 136 and/or an etch process is used to remove the top electrode 108/128 material, the capacitor dielectric 106 material, and the bottom electrode 104 material from over the top surface of the workpiece 102, as shown in FIGS. 4A and 4B. The etch process 114 is then used to recess portions of the bottom electrode 104 and the top electrode 108/128 by an amount comprising dimension $d_1$, as shown in FIGS. 4B and 4C. The entire thickness of the top surface of the bottom electrode 104 is recessed, and only the top surface of the first layer 108 of the top electrode 108/128 is recessed vertically.

Figure 4D:
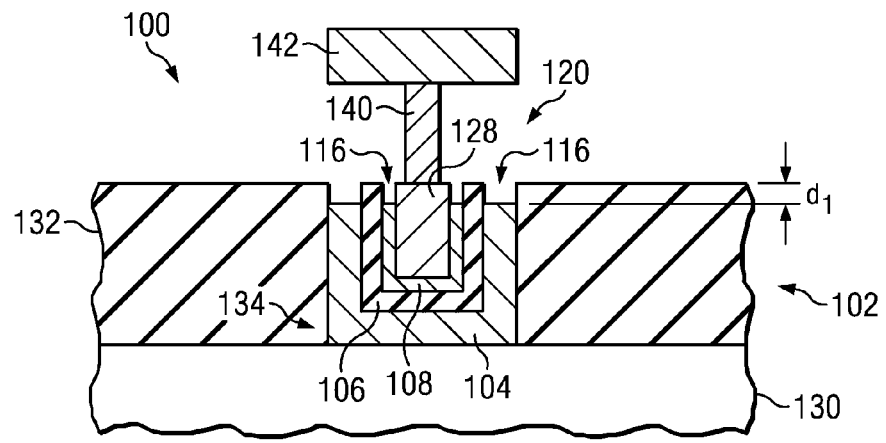
FIG. 4D is a cross-sectional view illustrating an advantage of the embodiment shown in FIGS. 4A through 4C.

FIG. 4D is a cross-sectional view of the semiconductor device 100 illustrating an advantage of the embodiment shown in FIGS. 4A through 4C. In a subsequent manufacturing step, a contact or via 140 may be formed over the top electrode 108, and a conductive line 142 may be formed over the contact or via 140, e.g., in subsequently-formed metallization or conductive material layers. Advantageously, the recessed top electrode 108 material provides an enhanced isolation process window between the capacitor 120 and the contact or via 140.

Figure 5A:
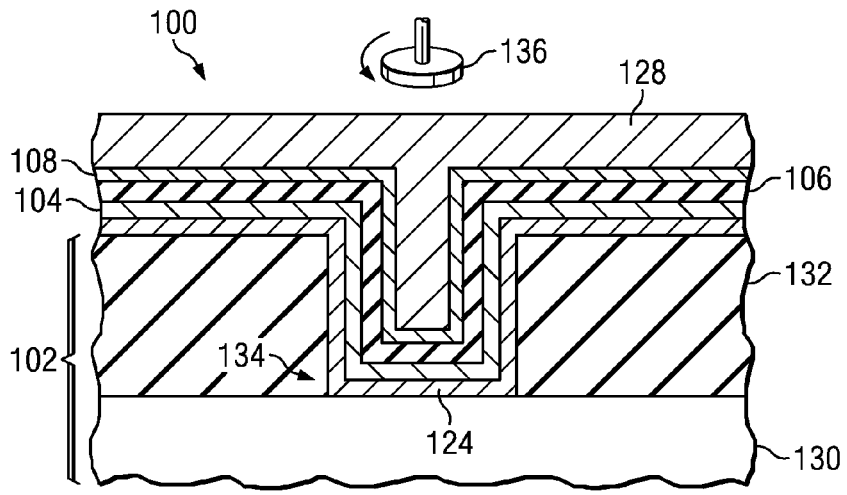
FIGS. 5A through 5C show cross-sectional views of a trench capacitor manufacturing method at various stages in accordance with yet another embodiment.
Figure 5B:
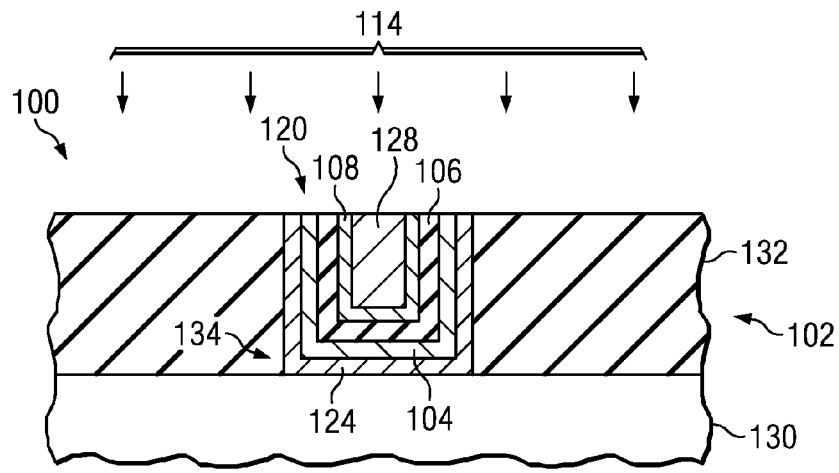
Figure 5C:
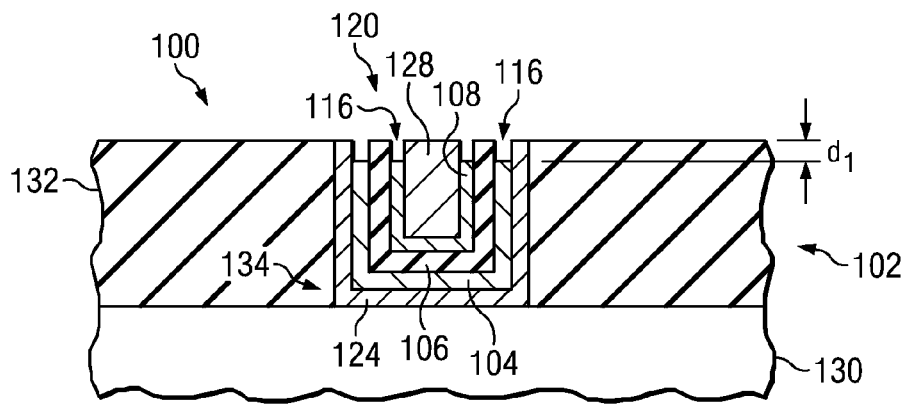

FIGS. 5A through 5C illustrate cross-sectional views of a trench capacitor 120 manufacturing method at various stages in accordance with yet another embodiment. Both the bottom electrode 104/124 and the top electrode 108/128 include a first layer 104 and 108 and a second layer 124 and 128, respectively, in this embodiment. Excess portions of the top electrode 108/128 material, the capacitor dielectric 106 material, and the bottom electrode 104/124 material are removed from over the top surface of the workpiece 102 using the CMP process 136 and/or etch process, as shown in FIGS. 5A and 5B. The etch process 114 is then used to recess portions (e.g., the first layers 104 and 108) of the bottom electrode 104/124 and the top electrode 108/128, as shown in FIGS. 5B and 5C. The first layers 104 and 108 of the bottom electrode 104/124 and the top electrode 108/128 are removed proximate the edges of the capacitor dielectric 106, as shown in FIG. 5C. The edges of the capacitor dielectric 106 of the capacitor 120 are disposed at top surfaces of the capacitor dielectric 106 in these embodiments.

Alternatively, the trench capacitor 120 formed using a damascene process may include a two layer bottom electrode 104/124 shown in FIG. 5C and a single layer top electrode 108 shown in FIG. 3D in accordance with another embodiment, not shown in the drawings. The bottom electrode 104 and 104/124 and the top electrode 108 and 108/128 may alternatively comprise three or more conductive material layers, with at least the conductive material layers adjacent the capacitor dielectric 106 being pulled-back, in accordance with another embodiment of the present disclosure.

Advantageously, only one lithography mask and one lithography process is needed to form the trench capacitors 120 in the embodiments shown in FIGS. 4A through 4D, 5A through 5C, and 6A through 6C; i.e., the lithography mask and process used to pattern the workpiece 102 to form the trenches 134. If the edges of the capacitor dielectric 106 are damaged during the CMP process 136 and/or etch process, at least a portion comprising the first layer 104 and 108 of the bottom electrode 104 or 104/124 and the top electrode 108 and 108/128 is recessed away from the damaged top surfaces of the capacitor dielectric 106, preventing or reducing deleterious effects on the capacitor 120 performance.

Figure 6A:
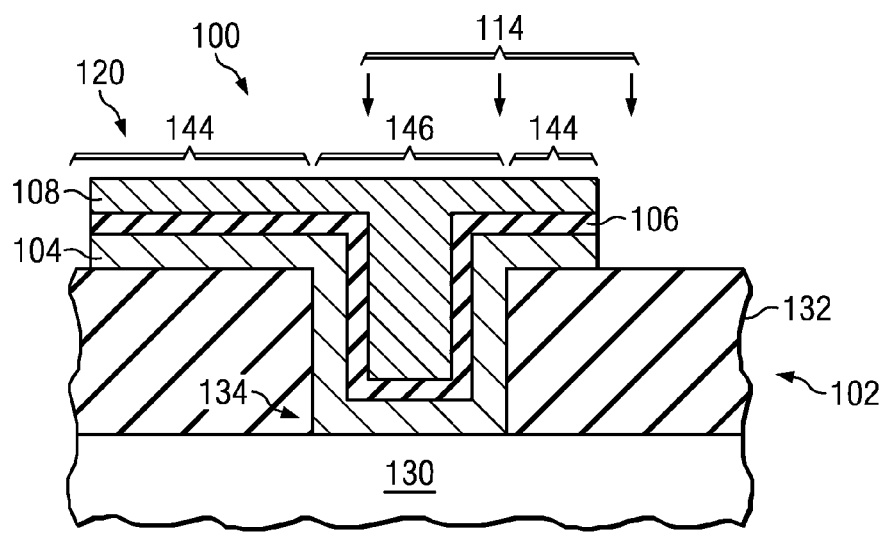
FIGS. 6A and 6B are cross-sectional views of another type of trench capacitor at various stages in accordance with an embodiment.
Figure 6B:
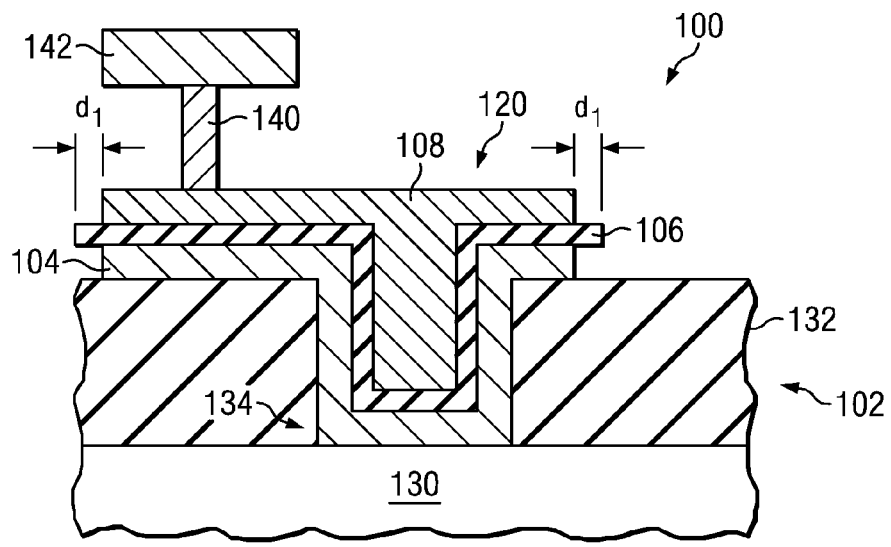

FIGS. 6A and 6B illustrate cross-sectional views of another embodiment of the present disclosure wherein a capacitor 120 is formed that comprises a combination of a planar capacitor and a trench capacitor. The manufacturing methods previously described herein are used to form the capacitor 120. The process described with respect to FIGS. 3A to 3B is first performed, but a CMP process 136 is not included. Rather, the process described with respect to FIGS. 1B to 1D is then performed. Two lithography masks are used in this embodiment; one to form the trench and another to pattern the capacitor material stack 104/106/108 disposed over the workpiece 102. Regions 144 comprise areas where the capacitor plates are planar, and region 146 comprises an area where the capacitor plates are formed in the trench. Edges of the top electrode 108 and the bottom electrode 106 material proximate the capacitor dielectric 106 edges (e.g., proximate the sidewalls of the capacitor dielectric 106) are recessed by dimension $d_1$ using the etch process 114, as described for FIG. 1D, as shown in FIG. 6B. A contact or via 140 and conductive line 142 may then be coupled to the top electrode 108 in subsequently formed conductive material layers of the semiconductor device 100.

Figure 7A:
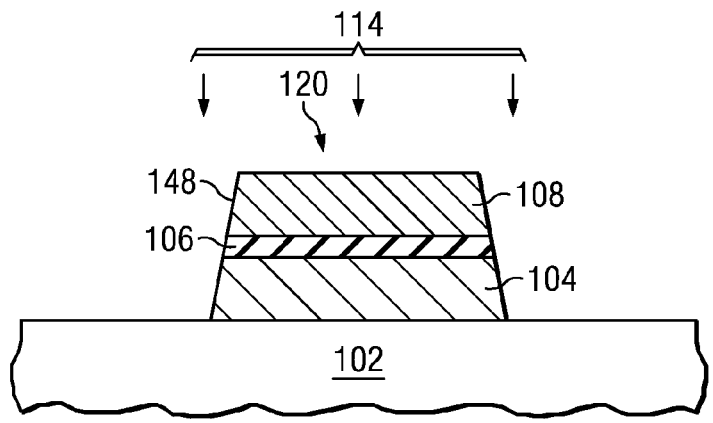
FIGS. 7A and 7B show cross-sectional views of yet another embodiment, wherein a planar capacitor comprises a ladder shape.
Figure 7B:
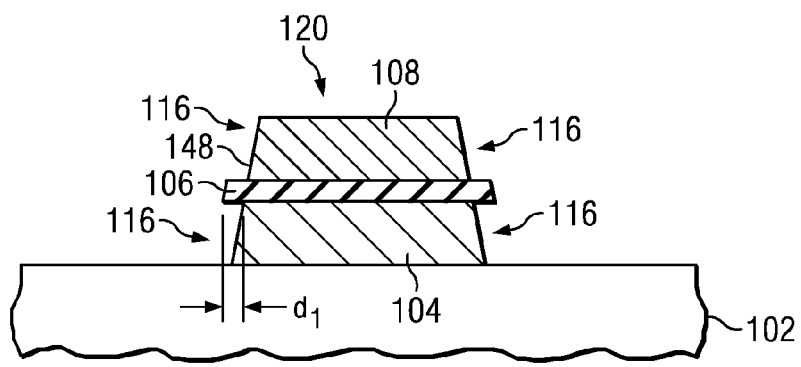

FIGS. 7A and 7B show cross-sectional views of another embodiment of the present disclosure wherein a capacitor 120 is formed that comprises a planar capacitor having a ladder shape. First, the manufacturing process shown and described with reference to FIG. 1A is performed. The first etch process 112 shown in FIG. 1B in this embodiment comprises a plasma etch process that is adapted to etch away more of the top electrode 108 material than the bottom electrode 104 material. Sidewalls 148 of the capacitor material stack 104/106/108 comprise a tapered or ladder shape after the first etch process 112, as shown in FIG. 7A. The second etch process 114 is then performed, recessing sidewalls of the top electrode material 108 and the bottom electrode material 104 proximate the edges of the capacitor dielectric 106 (e.g., proximate the sidewalls of the capacitor dielectric 106). The capacitor 120 comprises a tapered metal-insulator-metal (MIM) capacitor in this embodiment, for example.

Figure 8:
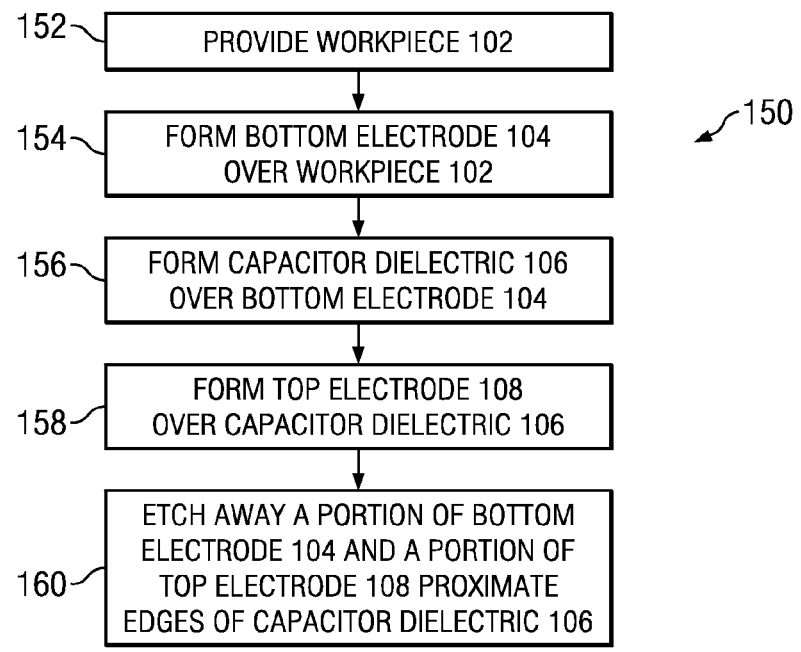
FIG. 8 is a flow chart showing an example of method of manufacturing a capacitor of a semiconductor device in accordance with an embodiment of the present disclosure.

FIG. 8 is a flow chart 150 showing an example of method of manufacturing a capacitor 120 of a semiconductor device 100 in accordance with an embodiment of the present disclosure. In step 152, a workpiece 102 is provided. In step 154, a bottom electrode 104 is formed over a workpiece 102. A capacitor dielectric 106 is formed over the bottom electrode 104 in step 156. In step 158, a top electrode 108 is formed over the capacitor dielectric 106. In step 160, a portion of the bottom dielectric 104 and a portion of the top electrode 108 are etched away proximate edges of the capacitor dielectric 106.

After the manufacturing processes shown in FIGS. 1D, 2D, 3D, 4C, 5C, 6A, and 7B, the manufacturing process for the semiconductor device 100 is then continued. For example, other devices may be formed within and/or over the workpiece 102, e.g., over the capacitors 120 or laterally with respect to the capacitors 120 in some embodiments. One or more insulating and/or conductive material layers may be formed over the capacitors 120 and the workpiece 102. Contacts and/or vias may be formed within one or more insulating material layers disposed over the capacitors 120 to make electrical contact to the bottom electrode 104 and/or top electrode 108, such as the conductive feature 122 shown in FIGS. 1E and 1F or the conductive features 140 and 142 shown in FIGS. 3E, 4D, and 6B, as examples.

The capacitors 120 may be implemented in memory devices, storage devices, soft error rate (SER) protection or robustness circuits, logic circuits, analog circuits, filters, analog-to-digital converters, control circuits, voltage regulators, delay circuits, storage enhancement circuits, or support circuits, as examples. In some embodiments, the capacitors 120 may be utilized in dynamic random access memory (DRAM) cells, for example. Alternatively, the capacitors 120 described herein may be used in other applications.

Advantages of embodiments of the disclosure include providing novel design methods, manufacturing processes, and structures for capacitors 120 of semiconductor devices 100. The novel pull-back methods of the electrodes 104, 104/124, 108 and 108/128 described herein may be implemented in planar capacitors 120, trench capacitors 120, or combinations thereof formed using damascene methods and/or subtractive etch methods. Only one lithography mask is required to manufacture the capacitors 120 in some embodiments, reducing manufacturing costs and time. The capacitors 120 have improved reliability due to the recessed portions (e.g., recesses 116) of the bottom electrodes 104 and 104/124 and top electrodes 108 and 108/128. Portions of the bottom electrodes 104 and 104/124 and top electrodes 108 and 108/128 are recessed away from possibly damaged edges of the capacitor dielectric 106, avoiding negative effects from the damaged capacitor dielectric 106 on the capacitor 120 performance. The novel manufacturing processes and capacitor 120 structures described herein advantageously may easily be implemented in existing manufacturing process flows.

In accordance with one embodiment of the present disclosure, a method of manufacturing a semiconductor device includes forming a capacitor over a workpiece. The capacitor includes a bottom electrode, a capacitor dielectric disposed over the bottom electrode, and a top electrode disposed over the capacitor dielectric. The method includes removing a portion of the bottom electrode and a portion of the top electrode proximate edges of the capacitor dielectric.

In accordance with another embodiment, a method of manufacturing a capacitor includes providing a workpiece, forming a bottom electrode over the workpiece, and forming a capacitor dielectric having edges over the bottom electrode. A top electrode is formed over the capacitor dielectric. A portion of the bottom electrode and a portion of the top electrode are etched away proximate the edges of the capacitor dielectric.

In accordance with yet another embodiment, a semiconductor device includes a workpiece and a capacitor disposed over the workpiece. The capacitor includes a bottom electrode, a capacitor dielectric disposed over the bottom electrode, and a top electrode disposed over the capacitor dielectric. A portion of the capacitor dielectric protrudes from edges of the bottom electrode and the top electrode.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a capacitor, the method comprising:
    etching a workpiece to form a trench, the trench extending into the workpiece from a major surface of the workpiece;
    lining the trench with a bottom electrode material;
    lining the bottom electrode material in the trench with a dielectric material, the dielectric material having edges proximate the major surface of the workpiece;
    forming a top electrode material over the dielectric material in the trench, the top electrode material filling the trench; and
    etching away a portion of the bottom electrode material and a portion of the top electrode material proximate the edges of the dielectric material.

2. The method of claim 1, wherein the workpiece comprises an insulating layer disposed over a semiconductor substrate, and wherein the etching the trench in the workpiece comprises etching the trench in the insulating layer, the trench exposing the semiconductor substrate of the workpiece.

3. The method of claim 1, wherein the etching away the portion of the bottom electrode material and the portion of the top electrode material comprises using an isotropic etch process.

4. The method of claim 1, wherein the etching away the portion of the bottom electrode material and the portion of the top electrode material comprises simultaneously etching away the portion of the bottom electrode material and the portion of the top electrode material.

5. The method of claim 1, wherein the etching away the portion of the bottom electrode material and the portion of the top electrode material comprises removing the portion of the bottom electrode material and the portion of the top electrode material, wherein substantially no portion of the dielectric material is removed.

6. The method of claim 1, wherein the etching away the portion of the bottom electrode material and the portion of the top electrode material comprises recessing the bottom electrode material and the top electrode material by a dimension in a range from about 5 to 300 Angstroms, the dimension measured from the major surface of the workpiece.

7. The method of claim 1, further comprising:
after the etching away, electrically connecting the top electrode material to a conductive feature.

8. A method of manufacturing a capacitor, the method comprising:
forming a trench in an insulating layer, the trench exposing a surface of a semiconductor substrate;
lining the trench and a major surface of the insulating layer with a bottom electrode material;
lining the bottom electrode material with a capacitor dielectric layer;
forming a top electrode material over the capacitor dielectric layer, the top electrode material filling the trench;
removing portions of the top electrode material, the capacitor dielectric layer, and the bottom electrode material disposed outside the trench; and
simultaneously recessing a portion of the top electrode material and a portion of the bottom electrode material remaining in the trench using an etching process, wherein the etching process is selective to material of the capacitor dielectric layer.

9. The method of claim 8, wherein the lining the trench and the major surface of the insulating layer with the bottom electrode material comprises conformally forming a first conductive layer over the insulating layer and conformally forming a second conductive layer over the first conductive layer, wherein the first conductive layer and the second conductive layer differ in composition.

10. The method of claim 9, wherein the first conductive layer comprises a material selected from the group consisting essentially of Cu, Ti, Ta, W, Ru, WN, Jr, Pt, and combinations thereof.

11. The method of claim 9, wherein the second conductive layer comprises a material selected from the group consisting essentially of TiN, TaN, W, WN, Ru, Jr, Pt, and combinations thereof.

12. The method of claim 9, wherein the simultaneously recessing the portion of the top electrode material and the portion of the bottom electrode material remaining in the trench comprises simultaneously removing the portion of the top electrode material and a portion of the second conductive layer of the bottom electrode material, but not a portion of the first conductive layer of the bottom electrode material.

13. The method of claim 8, wherein the forming the top electrode material over the capacitor dielectric layer comprises conformally forming a third conductive layer over the capacitor dielectric layer and conformally forming a fourth conductive layer over the third conductive layer, wherein the third conductive layer and the fourth conductive layer differ in composition.

14. The method of claim 13, wherein the simultaneously recessing the portion of the top electrode material and the portion of the bottom electrode material remaining in the trench comprises simultaneously removing the portion of the bottom electrode material and a portion of the third conductive layer of the top electrode material, but not a portion of the fourth conductive layer of the top electrode material.

15. The method of claim 8, wherein the removing portions of the top electrode material, the capacitor dielectric layer, and the bottom electrode material disposed outside the trench comprises using a chemical-mechanical polishing (CMP) process, wherein portions of the top electrode material, the capacitor dielectric layer, and the bottom electrode material remaining in the trench are substantially co-planar with the major surface of the insulating layer.

16. A method of manufacturing a capacitor, the method comprising:
forming a trench in a workpiece;
lining the trench and a major surface of the workpiece with a bottom electrode material;
lining the bottom electrode material with a dielectric material, the dielectric material having a first edge and a second edge opposite the first edge, the first edge and the second edge disposed outside the trench and over the major surface of the workpiece;
forming a top electrode material over the dielectric material; and
removing a portion of the bottom electrode material and a portion of the top electrode material proximate the first edge and the second edge of the dielectric material using an etch process.

17. The method of claim 16, wherein the etch process is selective to material of the dielectric material.

18. The method of claim 16, wherein the etch process comprises an isotropic etch process.

19. The method of claim 16, wherein the etch process comprises applying a dilute aqueous solution of ammonium hydroxide and hydrogen peroxide or a diluted ammonia and peroxide mixture (DAPM).

20. The method of claim 16, further comprising electrically connecting the top electrode material to a conductive via.

* * * * *